(12) United States Patent
Rho

(10) Patent No.: US 11,086,033 B2
(45) Date of Patent: Aug. 10, 2021

(54) METHOD OF DETERMINING X-RAY IMAGE FOR LIQUID CRYSTAL X-RAY DETECTOR

(71) Applicant: SESIM. LTD, Uiwang-si (KR)

(72) Inventor: Bong Gyu Rho, Suwon-si (KR)

(73) Assignee: SESIM. LTD, Uiwang-si (KR)

( * ) Notice: Subject to any disclaimer, the term of this patent is extended or adjusted under 35 U.S.C. 154(b) by 0 days.

(21) Appl. No.: 17/045,963

(22) PCT Filed: Mar. 18, 2019

(86) PCT No.: PCT/KR2019/003109
§ 371 (c)(1),
(2) Date: Oct. 7, 2020

(87) PCT Pub. No.: WO2019/212145
PCT Pub. Date: Nov. 7, 2019

(65) Prior Publication Data
US 2021/0124065 A1   Apr. 29, 2021

(30) Foreign Application Priority Data

May 2, 2018  (KR) .................... 10-2018-0050460

(51) Int. Cl.
*G01T 1/24* (2006.01)
*H01L 27/146* (2006.01)

(52) U.S. Cl.
CPC ........ *G01T 1/247* (2013.01); *H01L 27/14676* (2013.01)

(58) Field of Classification Search
CPC ........... G01T 1/247; G01T 1/24; G01T 1/246; H01L 27/14676; H01L 27/14663;
(Continued)

(56) References Cited

U.S. PATENT DOCUMENTS 4,135,096 A * 1/1979 Giordano ............... A61B 6/025
378/14
4,413,353 A * 11/1983 Macovski ............ G01N 23/041
378/62
(Continued)

FOREIGN PATENT DOCUMENTS

CN   100498375 C  *  6/2009
JP   2004-20442 A     1/2004
(Continued)

OTHER PUBLICATIONS

Rieppo et al., Amorphous selenium liquid crystal light valve for x-ray imaging, May 8, 1995, SPIE, vol. 2432, pp. 228-236. (Year: 1995).*
(Continued)

*Primary Examiner* — Christine S. Kim
(74) *Attorney, Agent, or Firm* — Stein IP, LLC

(57) ABSTRACT

Disclosed is a method of determining an X-ray image for a liquid crystal X-ray detector. The method includes a first step of measuring a reference transmittance of a pixel while varying a bias voltage in a state in which an X-ray sensing liquid crystal panel is not irradiated with an X-ray, a second step of separating electrons and holes in the X-ray sensing liquid crystal panel by applying a separation voltage and irradiating the X-ray sensing liquid crystal panel with an X-ray, a third step of measuring a detection transmittance of a pixel by applying a measurement voltage to the X-ray sensing liquid crystal panel, a fourth step of deriving a bias voltage of a reference transmittance of the pixel corresponding to the detection transmittance, and a fifth step of determining an X-ray image of the pixel by subtracting the measurement voltage from the bias voltage derived in the fourth step.

5 Claims, 14 Drawing Sheets

(58) Field of Classification Search
CPC . H01L 27/14625; G02F 1/135; G02F 1/1354; G01N 2223/03; G01N 2223/50
See application file for complete search history.

(56) References Cited

U.S. PATENT DOCUMENTS

| | | | |
|---|---|---|---|
| 7,687,792 B2 | 3/2010 | Rowlands et al. | 250/580 |
| 2013/0221241 A1* | 8/2013 | Rowlands | H04N 5/32 250/473.1 |
| 2015/0103975 A1* | 4/2015 | Yang | G01N 23/04 378/62 |
| 2016/0041275 A1* | 2/2016 | Lee | G01T 1/24 250/371 |
| 2021/0055610 A1* | 2/2021 | Rho | H01L 31/085 |

FOREIGN PATENT DOCUMENTS

| | | |
|---|---|---|
| KR | 10-2005-0043047 A | 5/2005 |
| KR | 10-2010-0010964 A | 2/2010 |
| KR | 10-2016-0043453 A | 4/2016 |
| KR | 6-0047314 A | 5/2016 |

OTHER PUBLICATIONS

International Search Report dated Jun. 11, 2019, issued to PCT/KR2019/003109.

\* cited by examiner

METHOD OF DETERMINING X-RAY IMAGE FOR LIQUID CRYSTAL X-RAY DETECTOR

CROSS-REFERENCE TO RELATED APPLICATIONS

This application national stage of International Application No. PCT/KR2019/003109, filed Mar. 18, 2019, which claims the benefit of Korean Application No. 10-2018-0050460, filed May 2, 2018, in the Korean Intellectual Property Office, the disclosures of which are incorporated herein by reference.

BACKGROUND OF THE INVENTION

1. Field of the Invention

The present invention relates to an X-ray imaging method. More particularly, the present invention relates to a method of determining an X-ray image for a liquid crystal X-ray detector, the method being capable of obtaining an X-ray image of a subject using liquid crystals that change in polarization transmission characteristics with respect to a read beam when the liquid crystals are irradiated with X-rays.

2. Description of the Related Art

An X-ray imaging apparatus converts a distribution of charges in a layer irradiated with X-rays transmitted through a subject into a digital signal, thereby imaging the interior structure of the subject. The X-ray imaging apparatus is extensively used in medical applications for patient diagnosis, non-destructive building inspection, and the like.

In recent years, X-ray detectors have employed digital technology or liquid crystal cells for improvement in performance thereof. For example, there is an X-ray detector using liquid crystal cells. This X-ray detector is referred to as a liquid crystal X-ray detector or an X-ray sensing liquid crystal detector. The liquid crystal X-ray detector is largely composed of a photoconductive element, a liquid crystal element, a light source, and a photodetector.

In the liquid crystal X-ray detector, when a photoconductive layer of the photoconductive element is irradiated with X-rays and a voltage is applied across two electrodes of the liquid crystal element, the X-rays transmitted through a subject cause polarization in the photoconductive layer while passing through the photoconductive layer. The polarization affects the liquid crystal layer such that the orientations of liquid crystal molecules are changed. Next, a read beam emitted from the light source passes through the liquid crystal layer and the read beam transmitted through the liquid crystal layer is imaged by an imaging lens. Through this process, an X-ray image of a subject is obtained.

However, the light path of the read beam incident on the imaging lens varies depending on the positions in the liquid crystal layer through which the read beam is transmitted. When light is transmitted through a center portion of the liquid crystal layer, the light can be entirely transmitted through the liquid crystal layer and can be incident on the imaging lens regardless of an incident angle thereof. However, when light is transmitted through a periphery portion of the liquid crystal layer, only a portion of the light can be transmitted and can be incident on the imaging lens according to an incident angle thereof.

That is, in an X-ray detector using liquid crystals, liquid crystal cells corresponding to pixels differ in field of view according to their position. Therefore, the amount of light collected by the imaging lens varies depending on the position of a pixel. Therefore, an error may occur in the intensity of the read beam detected by each pixel of a photodetector. As described above, when an image is output in a state where the intensity of the read beam detected by each pixel of the photodetector has an error, an inaccurate X-ray image is obtained. In this case, it is difficult to accurately diagnose a subject on the basis of the X-ray image of the subject.

To solve this problem, U.S. Pat. No. 7,687,792 (Patent Document 1) discloses a method of setting up an optical system in which a read beam perpendicularly passes through a liquid crystal layer and capturing an X-ray image multiple times while moving the optical system.

However, when using the image capturing method disclosed in Patent Document 1, an axial movement mechanism is additionally required, resulting in an increase in the cost of an X-ray detector. In addition, a current leaks from a liquid crystal layer over time while the X-ray image is taken multiple times. This also serves as a factor for distorting an X-ray image.

Accordingly, an X-ray detector using liquid crystals has a read beam dependency on a field of view. Therefore, there is a need for a method of correcting a difference in read beam transmittance depending on a field of view.

DOCUMENTS OF RELATED ART

Patent Document

Patent Document 1: U.S. Pat. No. 7,687,792 (issued as of Mar. 30, 2010)

SUMMARY OF THE INVENTION

An objective of the present invention is to provide a method of determining an X-ray image for a liquid crystal X-ray detector, the method being capable of obtaining an error-free X-ray image by correcting variation in read beam transmittance depending on a field of view.

Another objective of the present invention is to provide a method of determining an X-ray image for a liquid crystal X-ray detector, the method being capable of outputting a precise and accurate X-ray image without using a conventional multi-shooting technique involving the use of a lens moving mechanism.

In order to achieve the above objectives, there is provided a method of determining an X-ray image for a liquid crystal X-ray detector, the method including: a first step of measuring a reference transmittance of a pixel while varying a bias voltage applied to an X-ray sensing liquid crystal panel in a state in which the X-ray sensing liquid crystal panel is not irradiated with an X-ray; a second step of applying a separation voltage to the X-ray sensing liquid crystal panel and applying an X-ray to the X-ray sensing liquid crystal panel to separate electrons and holes from electron-hole pairs; a third step of measuring a detection transmittance of the pixel by applying a measurement voltage to the X-ray sensing liquid crystal panel; a fourth step of deriving a bias voltage of a reference transmittance of the pixel corresponding to the measured detection transmittance; and a fifth step of determining an X-ray image of the pixel by subtracting the measurement voltage used in the third step from the bias voltage derived in the fourth step.

The X-ray image determination method according to the present invention can correct a difference in read beam transmittance attributable to a difference in field of view of each pixel and correct an error of the intensity of the read beam detected by each pixel, thereby providing an accurate X-ray diagnostic image and securing the linearity of a liquid crystal X-ray detector.

In addition, the X-ray image determination method according to the present invention can output an accurate X-ray image without using a multi-shooting technique involving the use of an additional moving mechanism that is required in a conventional technique, thereby reducing the cost of an X-ray detector and the time taken for obtaining an X-ray image.

BRIEF DESCRIPTION OF THE DRAWINGS

The above and other objectives, features, and other advantages of the present invention will be more clearly understood from the following detailed description taken in conjunction with the accompanying drawings, in which.

DESCRIPTION OF THE PREFERRED EMBODIMENTS

The terminology used herein is for the purpose of describing particular embodiments only and is not intended to limit the scope of the present invention. As used herein, the singular forms "a", "an", and "the" are intended to include the plural forms as well unless the context clearly indicates otherwise. It will be further understood that the terms "comprises", "includes", or "has" when used in this specification specify the presence of stated features, regions, integers, steps, operations, elements and/or components, but do not preclude the presence or addition of one or more other features, regions, integers, steps, operations, elements, components and/or combinations thereof.

In addition, "on" or "above" means on or above an object, and does not necessarily mean an upper position based on the direction of gravity. Also, when a portion of a region, plate, or the like is referred to as being "on another portion or on top of another portion," it may be directly on, be in contact with, spaced from the other portion, or another portion may be interposed between them.

It is also to be understood that when one element is referred to herein as being "connected to" or "coupled to" another element, it may be connected or coupled directly to the other element, or connected or coupled to the other element via a mediating element interposed therebetween, unless specifically stated otherwise.

In addition, terms used in the specification, "first", "second", etc., may be used to describe various components, but the components are not to be construed as being limited to the terms. These terms are used only for the purpose of distinguishing a component from another component.

Herein below, preferred embodiments, advantages, and features of the present invention will be described in detail with reference to the accompanying drawings.

Figure 1:
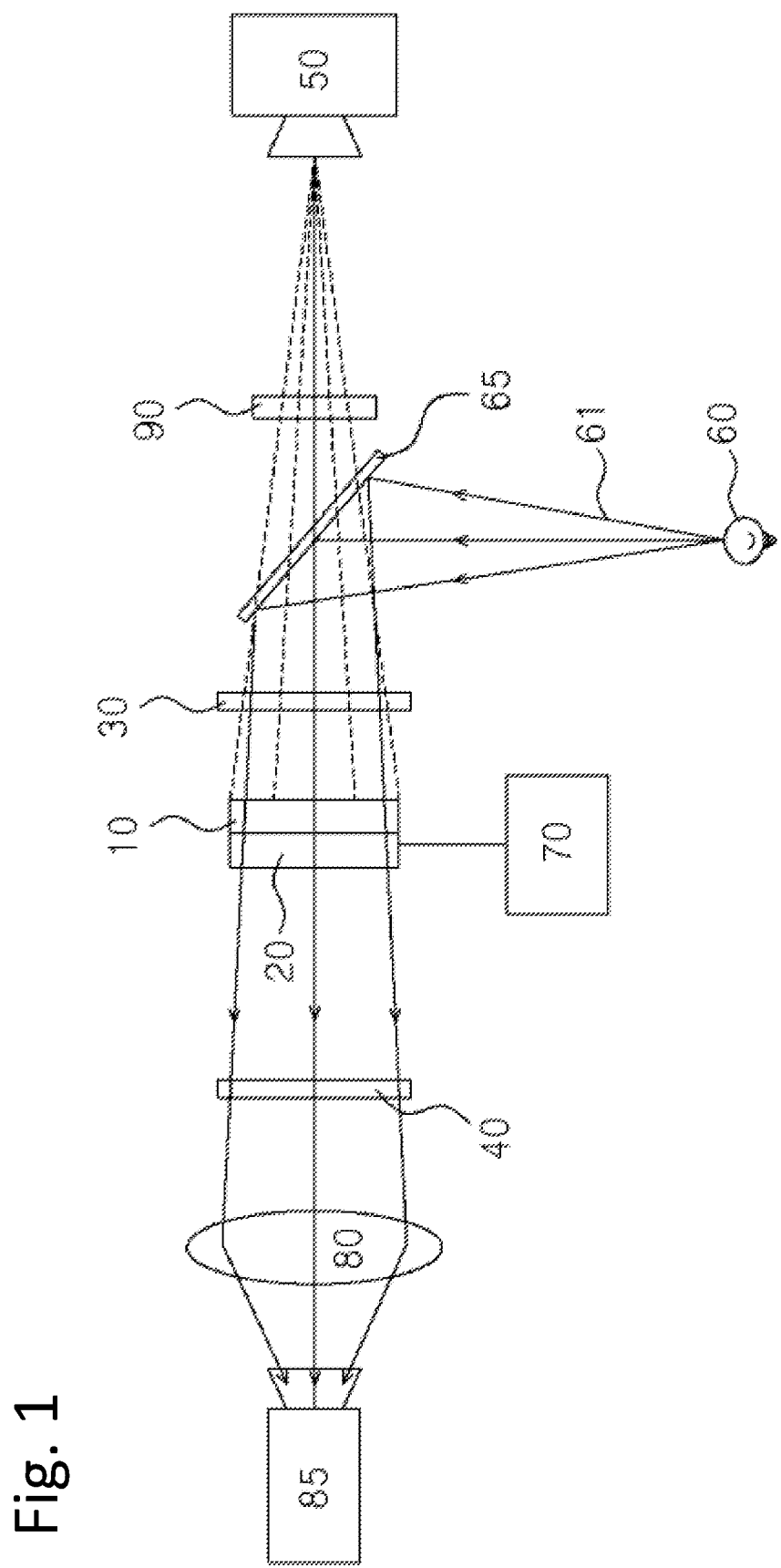
FIG. 1 is a diagram illustrating the overall construction of a liquid crystal X-ray detector according to one embodiment of the present invention.
Figure 2:
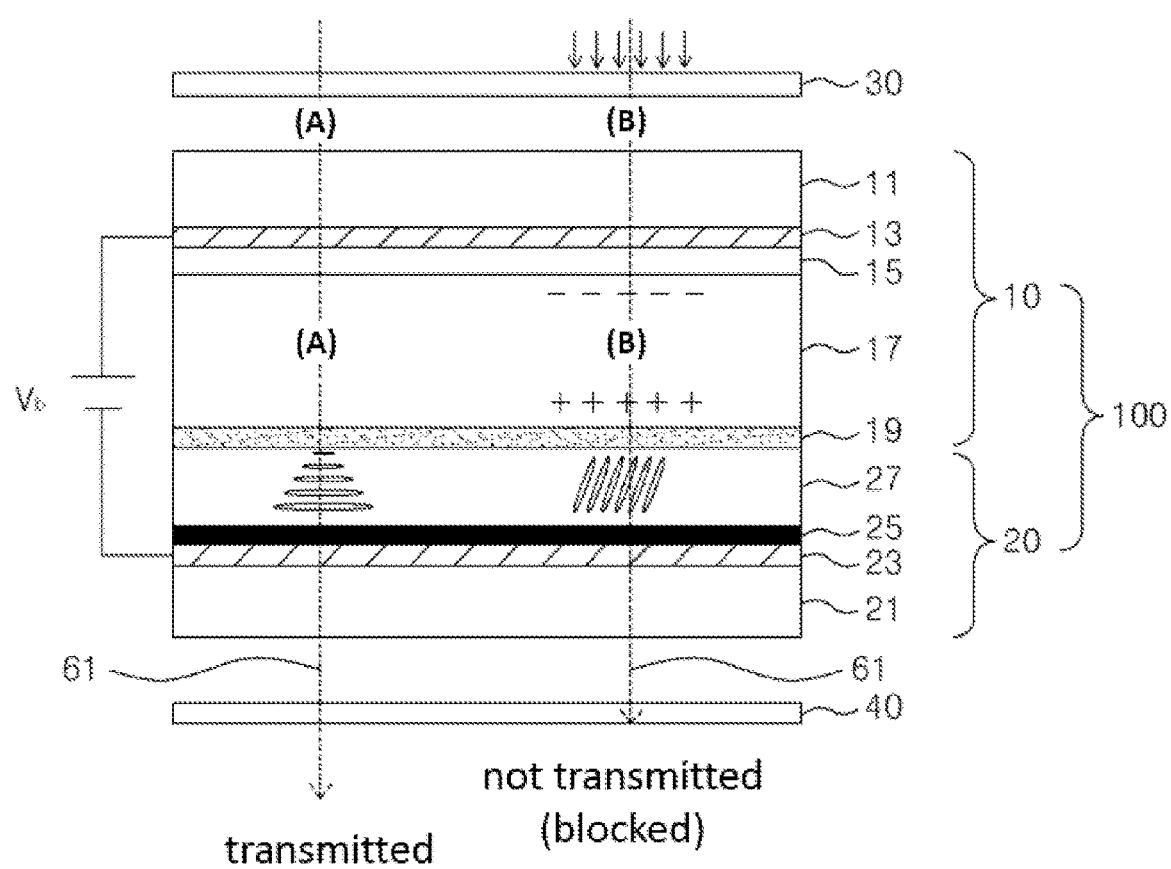
FIG. 2 is a cross-sectional view of an X-ray sensing liquid crystal panel according to one embodiment of the present invention.

FIG. 1 is a diagram illustrating the overall construction of an X-ray detector according to one embodiment of the present invention, and FIG. 2 is a cross-sectional view of an X-ray sensing liquid crystal panel according to one embodiment of the present invention.

Referring to FIGS. 1 and 2, according to one embodiment of the present invention, a liquid crystal X-ray detector includes an X-ray output unit 50, an X-ray sensing liquid crystal panel 100, a read beam output unit 60, a driver unit 70, a polarizing plate 30, an analyzer 40, an imaging lens 80, and an image pickup unit 85.

The X-ray output unit 50 generates X-rays and outputs them to the outside. The X-rays output from the X-ray output unit 50 are transmitted through a subject 90 and then absorbed by a photoconductive layer 17 of the X-ray sensing liquid crystal panel 100.

The X-ray sensing liquid crystal panel 100 has a structure in which a photoconductor unit 10 and a liquid crystal unit 20 are combined.

The photoconductor unit 10 is a component in which a distribution of electrons and holes changes when it is irradiated with X-rays or applied with an electric field. Specifically, the photoconductor unit 10 includes a substrate 11, a transparent conductive film 13, an insulating film 15, a photoconductive layer 17, and an alignment film 19.

The substrate 11 (hereinafter, referred to as first substrate 11) of the photoconductor unit 10 is a base member on which the transparent conductive film 13, the insulating film 15, the photoconductive layer 17, and the alignment film can be formed. The substrate 11 is made of transparent glass or resin.

The transparent conductive film 13 (hereinafter referred to as "first transparent conductive film 13") of the photoconductor unit 10 is an element to which a voltage is applied. The first transparent conductive film 13 is formed on one surface of the first substrate 11 and is electrically connected to the driver unit 70 described below.

When a voltage is applied between the transparent conductive film of the photoconductor unit 10 and the transparent conductive film of the liquid crystal unit 20 by the driver unit 70 described below, a DC electric field is created. The electric field causes movement of electrons and holes in the photoconductive layer 17. That is, a distribution of electrons and holes changes in the photoconductive layer 17.

The insulating film 15 of the photoconductor unit 10 is interposed between the first transparent conductive film 13 and the photoconductive layer 17 to prevent charge transfer between the first transparent conductive film 13 and the photoconductive layer 17.

The photoconductive layer 17 of the photoconductor unit 10 is an element for creating charges. When the photoconductive layer 17 is irradiated with X-rays, a large number of electron-hole pairs are generated in the photoconductive layer 17. When this photoconductor layer 17 is exposed to an electric field, the electric field causes movement of electrons and holes. That is, a change in the distribution of charges occurs.

The photoconductive layer 17 is formed in the form of a thin film on the insulating film 15 and is made of selenium. Preferably, the photoconductive layer 17 is made of amorphous selenium (a-Se). The amorphous selenium (a-Se) is formed through vacuum deposition or coating at low temperatures.

The alignment film 19 (hereinafter referred to as "first alignment film 19") of the photoconductor unit 10 is an element that uniformly aligns the orientation of each of the liquid crystal molecules in conjunction with an alignment film 25 of the liquid crystal unit 20.

The liquid crystal unit 20 is bonded to the photoconductor unit 10 and functions to selectively transmit specific polarized wavelengths of a read beam. The liquid crystal unit 20 includes a substrate 21, a transparent conductive film 23, an alignment film 25, and a liquid crystal layer 27.

The substrate 21 (hereinafter, referred to as second substrate 21) of the liquid crystal unit 20 is a base member on which the transparent conductive film 23, the alignment film 25, and the liquid crystal layer 27 are to be formed. The second substrate 21 is made of transparent glass or polymer.

The transparent conductive film 23 (hereinafter referred to as "second transparent conductive film 23") of the liquid crystal unit 20 is an element to which a voltage is applied. The second transparent conductive film 23 is formed on one surface of the second substrate 21 and is electrically connected to the driver unit 70 described below.

When a voltage is applied between the first transparent conductive film 13 and the second transparent conductive film 23, a DC electric field is generated between the first transparent conductive film 13 and the second transparent conductive films 23, thereby moving electrons and holes in the photoconductive layer 17. That is, a distribution of electrons and holes is changed in the photoconductive layer 17.

When the electric charge distribution in the photoconductor unit 10 changes due to X-ray irradiation and voltage application thereto, the orientation of the liquid crystals in the liquid crystal layer 27 of the liquid crystal unit 20 changes and the polarization transmission characteristic of the liquid crystal layer 27 with respect to the read beam accordingly changes. The liquid crystal layer 27 of the liquid crystal unit 20 includes a plurality of liquid crystal molecules injected into a gap between the first alignment film 19 and the second alignment film 25.

The alignment film 25 (hereinafter referred to as "second alignment film 25") of the liquid crystal unit 20 is formed on the second transparent conductive layer 23. When the liquid crystal unit 20 is bonded to the photoconductor unit 10, the second alignment film 25 is arranged to face the first alignment film 19, thereby uniformly aligning the liquid crystal molecules in conjunction with the first alignment film 19.

The read beam output unit 60 is an apparatus that emits a read beam 61. The read beam output unit 60 may be implemented with light-emitting diodes (LEDs) that emit light with wavelengths in a visible region.

Therefore, when the photoconductive layer is formed of amorphous selenium, the light (i.e., read beam 61) output from the read beam output unit 60 needs to be light having wavelengths in a range of 680 to 760 nm. Preferably, the light needs to have wavelengths in a range of 700 to 750 nm.

The half mirror 65 is an optical element disposed on the light path in front of the read beam output unit 60 and changes the light path so that the read beam 61 emitted from the read beam output unit 60 can be directed to the X-ray sensing liquid crystal panel 100.

The driver unit 70 is a component that applies a predetermined bias voltage Vb between the first transparent conductive film 13 and the second transparent conductive film 23 to separate electrons and holes from electron-hole pairs.

The polarizing plate 30 is disposed on the light path between the photoconductor unit 10 and the read beam output 60, and the analyzer 40 is disposed on the light path in front of the liquid crystal unit 20, so that the transmittance of the read beam changes depending on the polarization transmittance characteristics of the liquid crystal layer 27.

The imaging lens 80 is disposed on the light path in front of the analyzer 40. Therefore, the imaging lens 80 focuses the read beam transmitted through the analyzer 40 so as to be imaged by the image pickup unit 85.

The image pickup unit 85 is a device that detects the read beam 61 delivered from the imaging lens 80 and produces an image from which a state of a subject can be diagnosed. The image pickup unit 85 is implemented with a CCD camera or a CMOS camera.

The working principle of the liquid crystal X-ray detector will be described below.

As illustrated in FIG. 1, the liquid crystal X-ray detector according to one embodiment of the present invention has a structure in which the photoconductor unit 10 and the liquid crystal unit 20 are in face contact with each other. When the photoconductor unit 10 is irradiated with X-rays, electrons and holes are created in the photoconductive layer 17. In this state, when a DC electric field is applied between the first transparent conductive film 13 and the second transparent conductive film 23, a polarization phenomenon occurs in which the electrons and the holes move to their opposite polarity side, i.e., to the first transparent conductive film and the second conductive film, respectively, for example, or vice versa.

This polarization phenomenon affects the liquid crystal layer 27, thereby changing the state of the liquid crystal. That is, when the charge distribution changes as shown in FIG. 2, the arrangement of liquid crystals in the liquid crystal layer 27 changes.

More specifically, the electrons and holes are separated in the photoconductive layer 17 irradiated with X-rays, thereby blocking the internal electric field of the photoconductive layer 17. Therefore, the voltage applied to the liquid crystal layer 27 increases.

In the example of FIG. 2, a voltage applied to liquid crystal cells in a region A which is not irradiated with X-rays differs from a voltage applied to liquid crystal cells in a region B which is irradiated with X-rays. Therefore, the liquid crystal layer 27 locally varies in the polarization transmittance characteristic with respect to the read beam depending on whether it is irradiated with X-rays or not. Because of the local variation in the polarization transmittance characteristics throughout the liquid crystal layer 27, the power of the read beam that exits the analyzer after passing through the polarizing plate 30 varies. Therefore, an X-ray image for diagnosing the state of a subject can be obtained from the light exiting the analyzer 40.

Referring to FIG. 2, the read beam incident on the region A can pass through the analyzer 40 but the read beam incident on the region B cannot pass through the analyzer 40.

Accordingly, the read beam that is emitted in the form of scattered light or plane light from the read beam output unit 200 sequentially passes through the polarizing plate 30, the photoconductor unit 10, the liquid crystal unit 20, and the analyzer 40 and is then selectively incident on the imaging lens 80. The image pickup unit 85 detects the light delivered from the imaging lens 80 to obtain an X-ray image of a subject.

However, the light path of the read beam incident on the imaging lens 80 varies depending on the positions in the liquid crystal layer through which the read beam is transmitted. When light is transmitted through a center portion of the liquid crystal layer 27, the light can be incident on the imaging lens 80 and can be imaged by the image pickup unit 85 regardless of a direction in which the liquid crystal layer 27 is transmitted. However, when light is transmitted through a periphery portion of the liquid crystal layer 27, only a portion of the light that is incident on the periphery portion of the liquid crystal layer 27 at a specific angle can be transmitted through the liquid crystal layer 27 to be incident on the imaging lens 85 and to be imaged by the image pickup unit 85.

That is, in the liquid crystal X-ray detector, the field of view of each liquid crystal corresponding to each pixel of the image pickup unit 85 varies. This results in a variation in the amount of light collected by the imaging lens depending on the position of each pixel. Therefore, the power of the read beam for each pixel of the image pickup unit 85 varies, resulting in an error of an image signal. When an image is output in a state in which the power of the read beam detected by each pixel of the image pickup unit 85 is distorted, an incorrect X-ray image is obtained.

Accordingly, the inventors of the present invention has developed a method of correcting a difference in read beam transmittance depending on a field of view of a liquid crystal by measuring the transmittance according to a bias voltage and by using the measured transmittance as a reference value.

Hereinafter, an X-ray image determination method capable of correcting a difference in read beam transmittance depending on a field of view of a liquid crystal will be described below.

Figure 3:
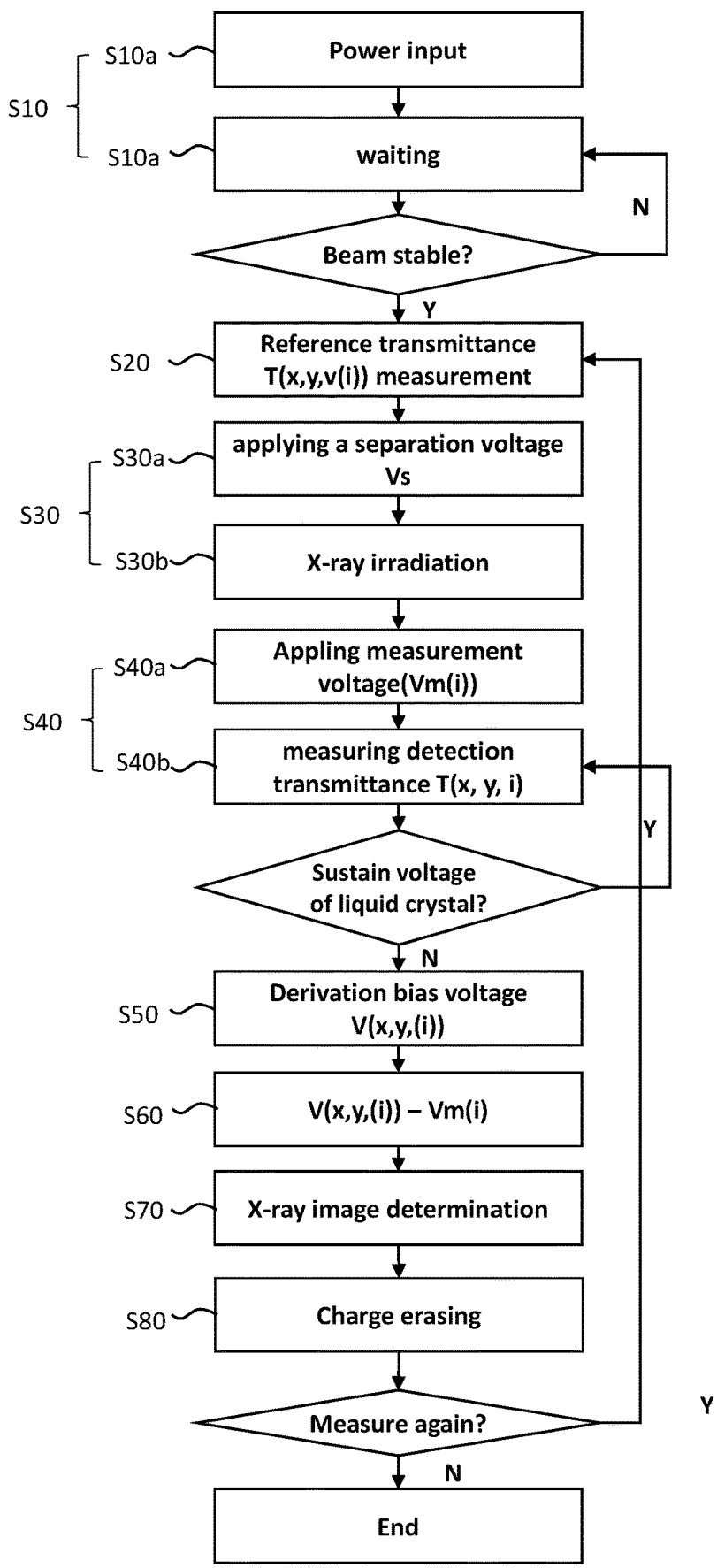
FIG. 3 is a flowchart illustrating a method of determining an X-ray image for a liquid crystal X-ray detector, according to one embodiment of the present invention.

FIG. 3 is a flowchart illustrating a method of determining an X-ray image for a liquid crystal X-ray detector, according to one embodiment of the present invention. Referring to FIG. 3, according to one embodiment of the present invention, an X-ray image determination method for a liquid crystal X-ray detector includes a read beam output step S10, a reference transmittance measurement step S20, an electron-hole separation step S30, a detection transmittance measurement step S40, a bias voltage derivation step S50, a correction value calculation step S60, an X-ray image determination step S70, and a charge erasing step S80.

In the read beam output step S10, a liquid crystal X-ray detector is powered (S10a) and a read beam output unit 60 is driven to output a read beam.

Preferably, in the read beam output step S10, there is a wait time until the intensity of the read beam is stabilized (S10b), and then the reference transmittance measurement step is performed when the output of the read beam output unit is stabilized.

The reference transmittance measurement step S20 is a step of measuring a transmittance [T (x, y, V(i))] of a pixel while varying a bias voltage Vb applied to the X-ray sensing liquid crystal panel 100 before the X-ray sensing liquid crystal panel is irradiated with X-rays.

Here, the bias voltage Vb is applied between the first transparent conductive film 13 and the second transparent conductive film 23 of the X-ray sensing liquid crystal panel 100 by the driver unit 70. The term "pixel" refers to a pixel of the image pickup unit 85 of a camera. The term "transmittance of a pixel" refers to a read beam transmittance of a pixel according to a field of view of a liquid crystal cell corresponding to the pixel. In the transmittance [T(x, y, V(i))] in Step S20, "x,y" refers to the coordinates of a pixel of the image pickup unit 85, and "V(i)" refers an i-th bias voltage that is a bias voltage set in an i-th turn when measuring the transmittance while varying the bias voltage.

Figure 8:
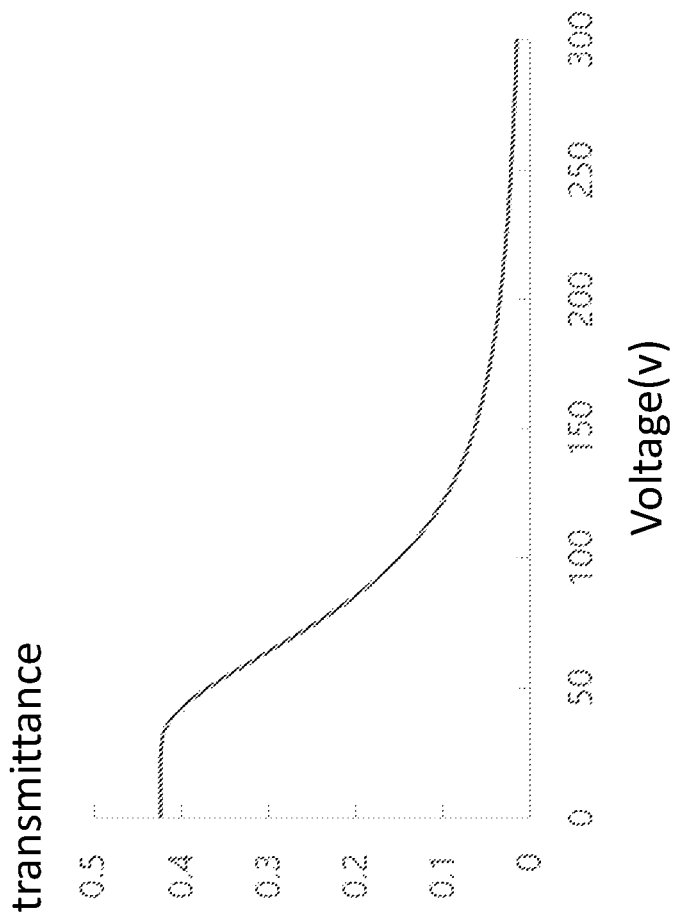
FIG. 8 is a reference transmittance curve of a pixel corresponding to a field of view (0, 0) of a liquid crystal layer.

Hereinafter, the transmittance of a pixel measured in Step S20 is referred to as "reference transmittance [T(x, y, V(i))]". Therefore, by plotting the reference transmittances collected through the reference transmittance measurement step S20, a reference transmittance curve as shown in FIG. 8 is obtained.

The electron-hole separation step S30 includes a sub-step S30a of applying a separation voltage Vs to the X-ray sensing liquid crystal panel and a sub-step S30b of irradiating the X-ray sensing liquid crystal panel with X-rays to separate electrons and holes in the photoconductor unit.

When the photoconductor unit 10 is irradiated with X-rays, electrons and holes are created in the photoconductive layer 17. In this state, when a DC electric field is applied between the first transparent conductive film 13 and the second transparent conductive film 23, a polarization phenomenon occurs in which the electrons and the holes move to their opposite polarity side, i.e., to the first transparent conductive film and the second conductive film, respectively, for example, or vice versa.

Referring to FIG. 2, since a positive voltage is applied to the first transparent conductive film 13, the holes are distributed in a lower portion of the photoconductive layer 17 and the electrons are distributed in an upper portion of the photoconductive layer 17. That is, the holes gather in a region near the liquid crystal layer 27 and the electrons gather in a region near the first transparent conductive film 13.

The detection transmittance measurement step S40 includes a sub-step S40a of applying a measurement voltage Vm to the X-ray sensing liquid crystal panel 100 and a sub-step S40b of measuring a transmittance [T(x, y, i)] of a pixel of the image pickup unit 85. In the transmittance [T (x, y, i)] in Step S40, "x, y" refers to the coordinates of a pixel of the image pickup unit 85, and "i" means that the transmittance of the corresponding pixel is measured multiple times while the voltage applied to the liquid crystal layer 27 is maintained.

The measurement voltage Vm used in the detection transmittance measurement step S40 is set to be constant while the detection transmittance is measured or is set to be varied while the detection transmittance is measured.

The bias voltage derivation step S50 is a step of finding a reference transmittance having the same value as the detection transmittance [T(x, y, i)] measured in Step S40 and deriving a bias voltage [V(x, y, i)] corresponding to the reference transmittance.

The correction value calculation step S60 is a step of performing an operation of subtracting the measurement voltage Vm used in Step S40 from the bias voltage V(x, y, i) derived in Step S50.

The X-ray image determination step S70 is a step of determining an X-ray image on the basis of the value calculated in Step S60. That is, when an X-ray image (i.e., intensity of an X-ray) of a pixel is determined on the basis of the bias voltage from which the measurement voltage used in StepS40 is subtracted, it is possible to correct an error of a transmittance attributable to a difference in the field of view of a liquid crystal cell corresponding to the pixel.

When Steps S20 through S70 are applied to every pixel of the image pickup unit 85, the X-ray image of every pixel within the entire diagnostic area of a subject is determined. Therefore, the resulting X-ray image is an accurate X-ray image that is free of errors in the read beam intensity of each pixel, which usually occurs in an X-ray image obtained by a conventional liquid crystal X-ray detector.

The charge erasing step is a step of removing charges accumulated in the photoconductive layer 17. According to one embodiment, the charge erasing step is performed by irradiating the photoconductive layer 17 with UV radiation in a state in which the bias voltage is the ground voltage (0 V) or a state in which a square wave having a frequency lower than 5 Hz is applied. Under either of the conditions, the separated charges (i.e., electrons and holes) are combined in the photoconductive layer 17.

When the charge erasing step is completed, an X-ray image acquisition can be performed on the subject again by repeating Steps S10 through S80.

Hereinafter, the preferred embodiment of the present invention will be described in more detail with reference to test examples and the results thereof illustrated in FIGS. 4 to 14.

Figure 4:
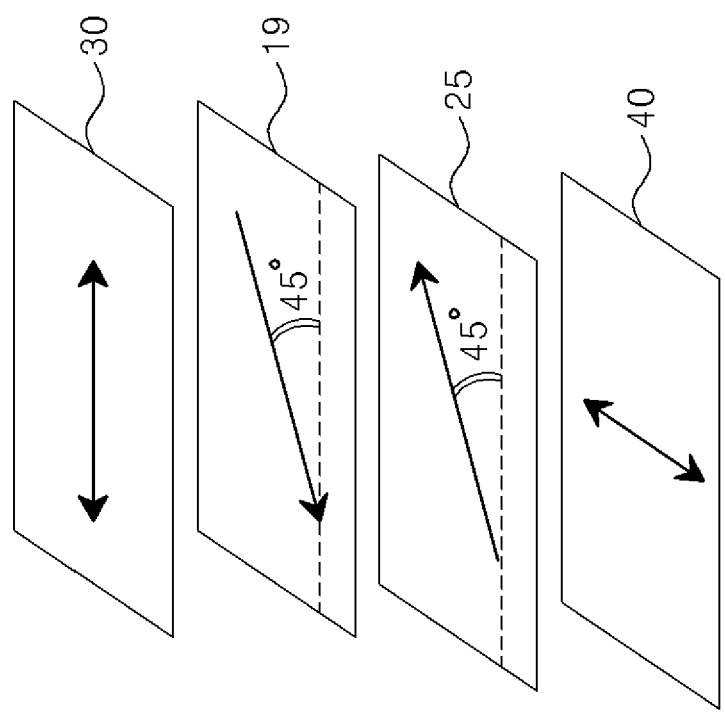
FIG. 4 is a diagram illustrating the structures of a polarizing plate, a liquid crystal layer, and an analyzer used test the X-ray image determination method according to one embodiment of the present invention.

FIG. 4 is a diagram illustrating a polarizing plate, a liquid crystal layer, and an analyzer that are used to test the X-ray image determination method according to one embodiment of the present invention.

Referring to FIG. 4, a polarizing plate 30 and an analyzer 40 are disposed such that their transmission axes are orthogonal to each other. That is, the transmission axis of the polarizing plate 30 is in line with an X-axis, and the transmission axis of the analyzer 40 is disposed in line with a Y-axis orthogonal to the X-axis.

A first alignment film 19 that is an alignment film 19 of a photoconductor unit 10 is rubbed in a direction having an angle of 225°, and a second alignment film 25 that is an alignment film 25 of a liquid crystal unit 20 is rubbed in a direction having an angle of 45°.

Figure 5:
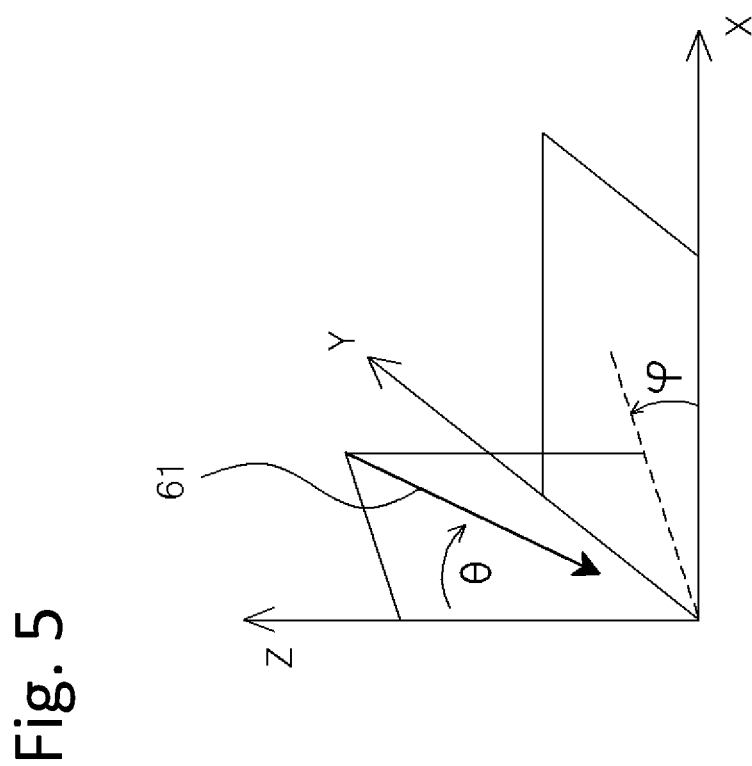
FIG. 5 is a coordinate system defining a field of view (θ, φ) of a liquid crystal layer.

FIG. 5 is a coordinate system defining a field of view (θ, φ) of a liquid crystal layer in the present invention, in which "θ" represents a polar angle and "φ" represents an azimuth angle. In FIG. 5, the angle between the direction in which the read beam travels through the liquid crystal and the Z-axis is θ.

Figure 6:
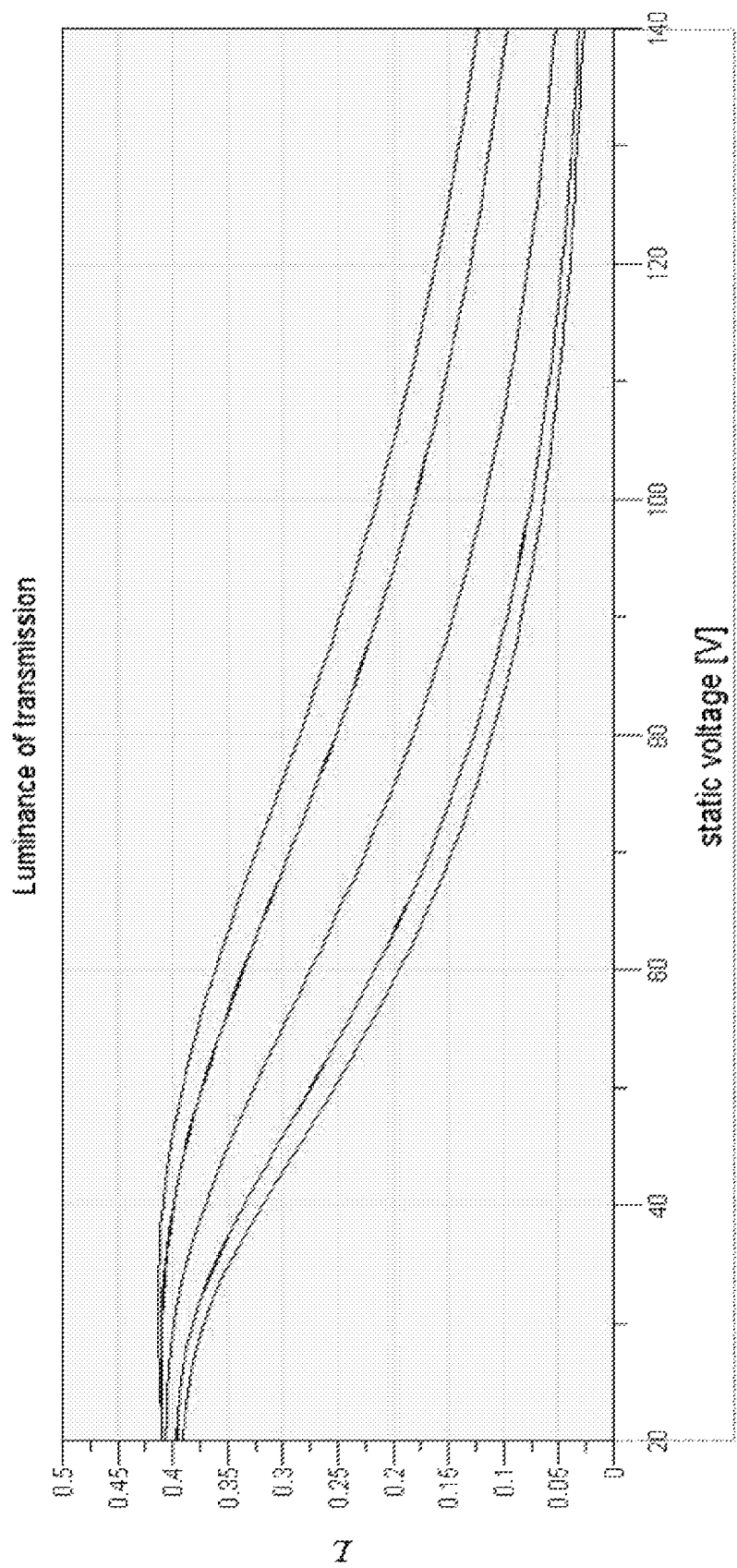
FIG. 6 is a transmission curve according to an azimuth angle φ of the liquid crystal layer at a polar angle of 15° C.

FIG. 6 illustrates a test example showing a read beam transmittance according to a field of view of a liquid crystal layer at a polar angle of 15°. In the test, the transmittance is measured by applying an AC square wave between the transparent conductive film 13 of the photoconductor unit 10 and the transparent conductive film 23 of the liquid crystal unit 20.

In the test example illustrated in FIG. 6, the azimuth angle is changed from 0° to 315° at an interval of 45°. Therefore, a total of eight transmittance curves are obtained at eight azimuth angles, respectively. However, since three of the eight transmittance curves are the same with others, FIG. 6 shows only five transmittance curves.

As illustrated in FIG. 6, since the transmittance varies depending on the direction in which the read beam passes through the liquid crystal layer 27, i.e., depending on the field of view of the liquid crystal. Therefore, when the X-ray intensity is determined only on the basis of the transmittance curve as it is, a distorted X-ray image may be obtained.

A voltage change caused by charges separated in the photoconductive layer 17 can be obtained by Equation 1 and Equation 2.

When the amount of charges of the photoconductive layer 17 is denoted by C(P), the amount of charges of the liquid crystal layer 27 is denoted by C(LC), and the density of the separated charges in the photoconductive layer 17 is denoted by ±a, the voltage V(LC) applied to a region which is not irradiated with X-rays is calculated by Equation 1 and the voltage V(LC') applied to a region which is irradiated with X-rays is calculated by Equation 2.

$$V(LC) = \frac{C(P)}{C(LC) + C(P)} Vb \qquad \text{[Equation 1]}$$

$$V(LC') = \frac{C(P)}{C(LC) + C(P)} Vb + \frac{\sigma}{C(LC) + C(P)} \qquad \text{[Equation 2]}$$

As can be seen from Equation 1 and Equation 2, when the amount of charges of the liquid crystal layer 17 according to an applied voltage is determined, the voltage change of the liquid crystal layer 17 according to the charge density can be calculated. When the voltage change of the liquid crystal layer 17 is determined, the charge density can be determined. However, the amount of charges of the liquid crystal layer 17 varies depending on the thickness of the liquid crystal layer 17 and the voltage applied to the liquid crystal layer 17. Therefore, it is difficult to reversely determine the charge density from the change in voltage applied to the liquid crystal layer 17.

However, the inventors have discovered that it is possible to determine the accurate intensity of X-rays without errors in the case of using the transmittance that changes according to the bias voltage.

That is, as in Step S20 described above, a reference transmittance curve is generated by measuring a transmittance of each pixel of the image pickup unit 85 while varying the bias voltage Vb applied to the X-ray sensing liquid crystal panel 100 in a state in which the X-ray sensing liquid crystal panel is not irradiated with X-rays. The voltage change of the liquid crystal layer 17 is tracked on the basis of the reference transmittance curve.

Figure 7:
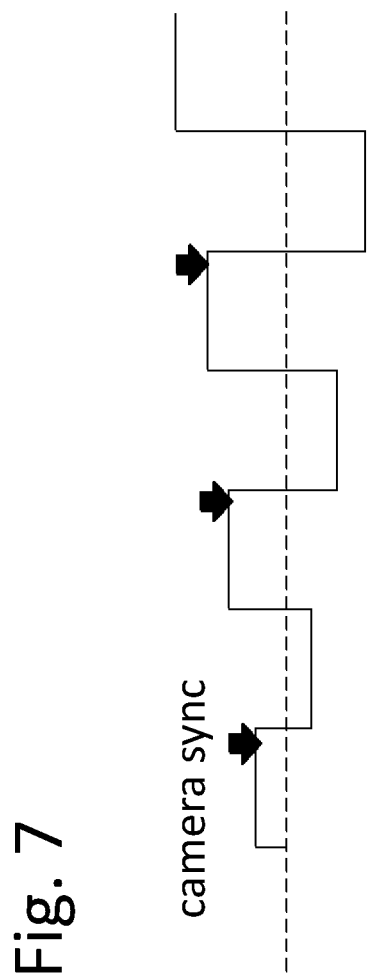
FIG. 7 is a bias waveform used to obtain a reference transmission curve according to the present invention.

FIG. 7 illustrates a bias waveform used to obtain a reference transmission curve according to the present invention. Referring to FIG. 7, the reference transmittance curve shown in FIG. 8 is obtained by measuring a read beam transmittance in a predetermined time zone of (+) polarity while raising the voltage of a drive wave having a frequency of about 30 Hz. Since the read beams entering the pixels of the image pickup unit 85 of the camera vary in the direction in which it passes through the liquid crystal layer 27, the reference transmittance is measured for each pixel.

FIG. 8 is a reference transmittance curve of a pixel corresponding to a field of view (0, 0) of a liquid crystal layer according to one embodiment of the present invention. That is, it is a reference transmittance curve according to a bias voltage for a read beam that passes in a perpendicular direction through the liquid crystal layer 27.

Specifically, the liquid crystal layer 27 used in the test example of FIG. 8 had a thickness of 10 μm, a short-axis dielectric constant of 3.6, a long-axis dielectric constant of 8.0, and a refractive index anisotropy of 0.035. The photoconductive layer 17 used in the test example of FIG. 8 had a dielectric constant of 6.0 and a thickness of 300 μm. The wavelength range of the read beam was 700 to 750 nm and the intensity of the read beam was constant for each wavelength.

When measuring the reference transmittance, there is a region in which the transmittance does not change even though the bias voltage varies. The voltage at which the transmittance begins to change through this region is referred to as "threshold voltage" Vth. X-ray imaging needs to be performed at or above the threshold voltage.

Figure 9:
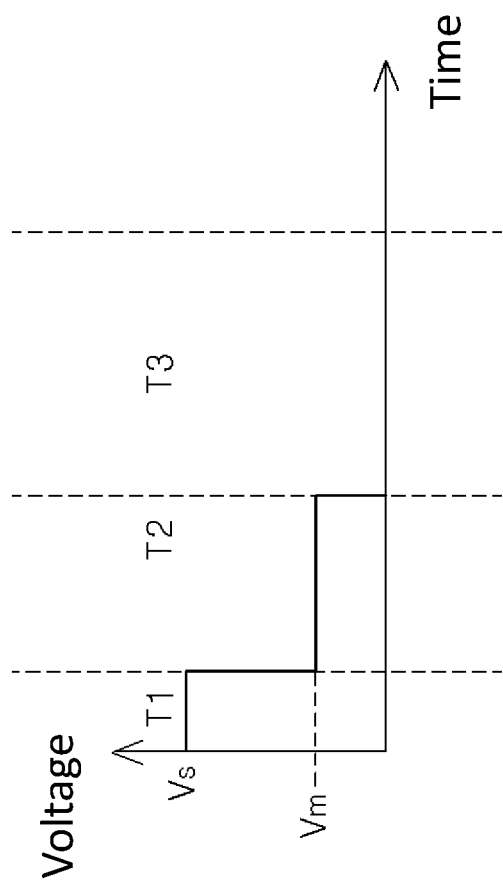
FIG. 9 is a drive waveform of a liquid crystal X-ray detector according to one embodiment of the present invention.

FIG. 9 is a drive waveform for a liquid crystal X-ray detector according to one embodiment of the present invention. The drive waveform is divided into three stages: a charge separation period T1, a transmission measurement period T2, and a charge erasing period T3.

In the charge separation period T1, a high DC voltage is applied to the photoconductive layer 17 to separate electrons and holes from each other. In the transmittance measurement period T2, a voltage higher than the threshold voltage is applied to measure the transmittance. The charges accumulated in the photoconductive layer 17 are removed by irradiating the photoconductive layer 17 with UV radiation while grounding the bias voltage to 0 V. In the test example shown in FIG. 9, the bias voltage is grounded in the charge erasing period. However, instead of grounding the bias voltage, a square wave having a frequency lower than 5 Hz may be applied.

The separation voltage Vs applied during the charge separation period T1 varies depending on the material and thickness of the photoconductive layer 17. When the photoconductive layer 17 is made of amorphous selenium, the applied voltage may be 10 V per μm in thickness. For example, when the photoconductive layer 17 has a thickness of 300 μm, a separation voltage Vs of 3 KV is applied.

In the transmittance measurement period T2, a measurement voltage Vm higher than the threshold voltage Vth of the reference transmittance curve is applied. The detection transmittance is measured multiple times to reduce an error.

Commercial liquid crystal used for TFT LCD devices has a voltage retaining rate of 99.9% for 17 ms. Therefore, the detection transmittance is measured multiple times to reduce the measurement noise. The measurement noise is inversely proportional to the square root of the number of measurements. Therefore, when the measurement noise for one measurement is ±δ, the average value of four times of measurement is ±δ/2.

Figure 10:
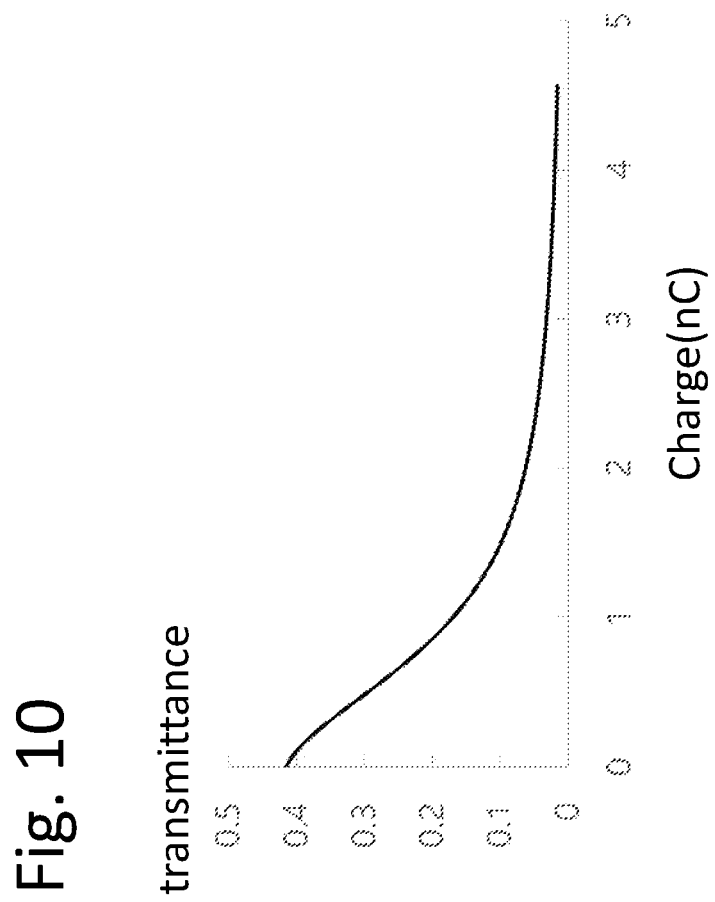
FIG. 10 is a transmittance curve according to an amount of charge accumulated in a photoconductive layer at a field of view (0, 0) of a liquid crystal layer.

FIG. 10 is a transmittance curve according to a charge amount per 1 cm$^2$ of a photoconductive layer according to one embodiment of the present invention. That is, FIG. 10 shows a transmittance for a charge amount in a photoconductive layer of a pixel corresponding to a field of view (0, 0) at a measurement voltage Vm of 36 V.

When the curve of transmission-to-charge shown in FIG. 10 is obtained, a transmittance can be determined, and an X-ray image can be determined. However, in order to obtain the curve shown in FIG. 10, the transmittance must be measured while increasing the dose of X-ray radiation. However, since it is difficult to uniformly maintain the dose of X-ray radiation and it is required to erase the generated charges after each time measurement is performed, it is very difficult and inefficient to obtain the curve shown in FIG. 10.

The inventors of the present invention has solved the problem described above by identifying a correlation between a charge amount and a bias voltage for the same transmittance from the reference transmittance curve of FIG. 8 and the transmittance-to-charge curve of FIG. 10.

Figure 11:
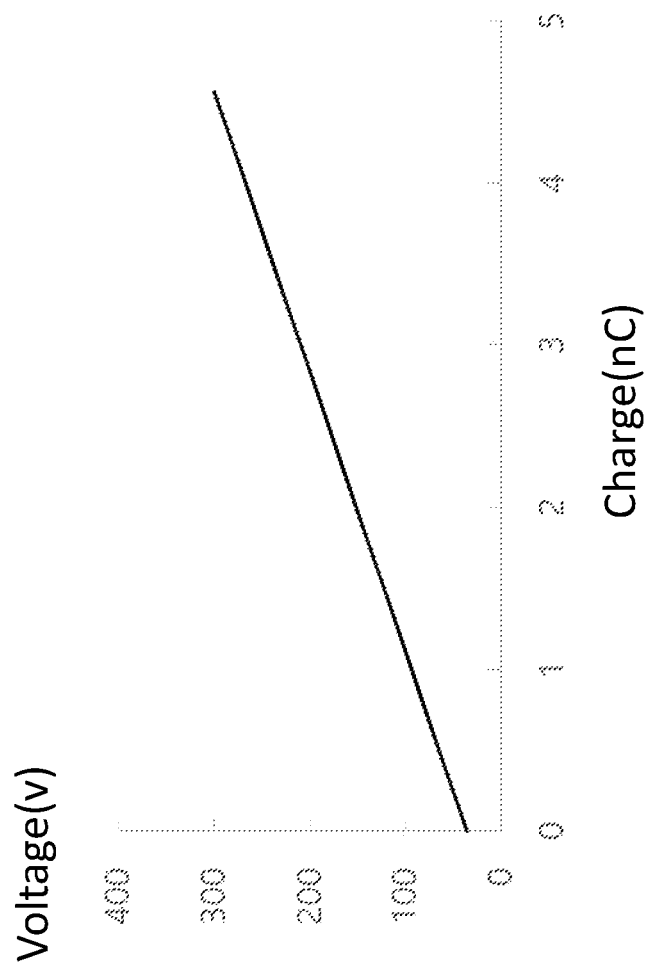
FIG. 11 is a graph showing a correlation between a bias voltage of a reference transmittance curve and an amount of charge in a photoconductive layer of a pixel corresponding to a field of view (0, 0) of a liquid crystal layer.

FIG. 11 is a graph showing a bias voltage for a reference transmittance according to a charge amount in a photoconductive layer according to one embodiment of the present invention. That is, FIG. 11 is a reference transmittance curve of a pixel corresponding to a field of view (0, 0) at a measurement voltage Vm of 36 V.

A detection transmittance of a pixel is measured with a measurement voltage Vm. When a bias voltage corresponding to the detection transmittance is found to be Vb with reference to the reference transmittance curve, the charge density a of the photoconductive layer 17 corresponding to the pixel is calculated according to Equation 3.

$$\sigma = k(Vb - Vm) \quad \text{[Equation 3]}$$

(where σ: charge density, Vb: bias voltage derived in Step S50, Vm: measurement voltage applied in Step 40, k: proportional constant)

In FIG. 11 and Equation 3, the proportional constant (k) is 0.172808.

In order to observe a case of a different field of view, the inventors obtained a reference transmittance curve of a pixel having a polar angle θ of 20° and an azimuth angle φ of 225° and performed a test for a case where the measurement voltage Vm was 60V.

Figure 12:
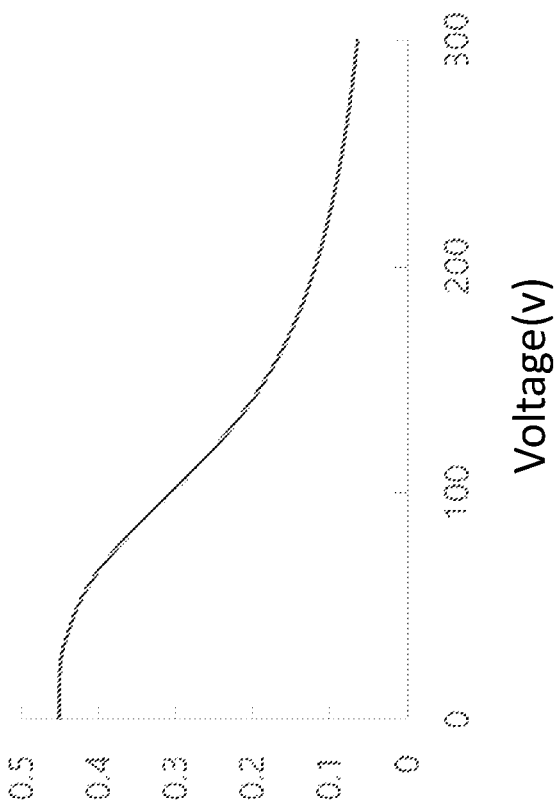
FIG. 12 is a reference transmittance curve of a pixel corresponding to a field of view (20,225) of a liquid crystal layer.
Figure 13:
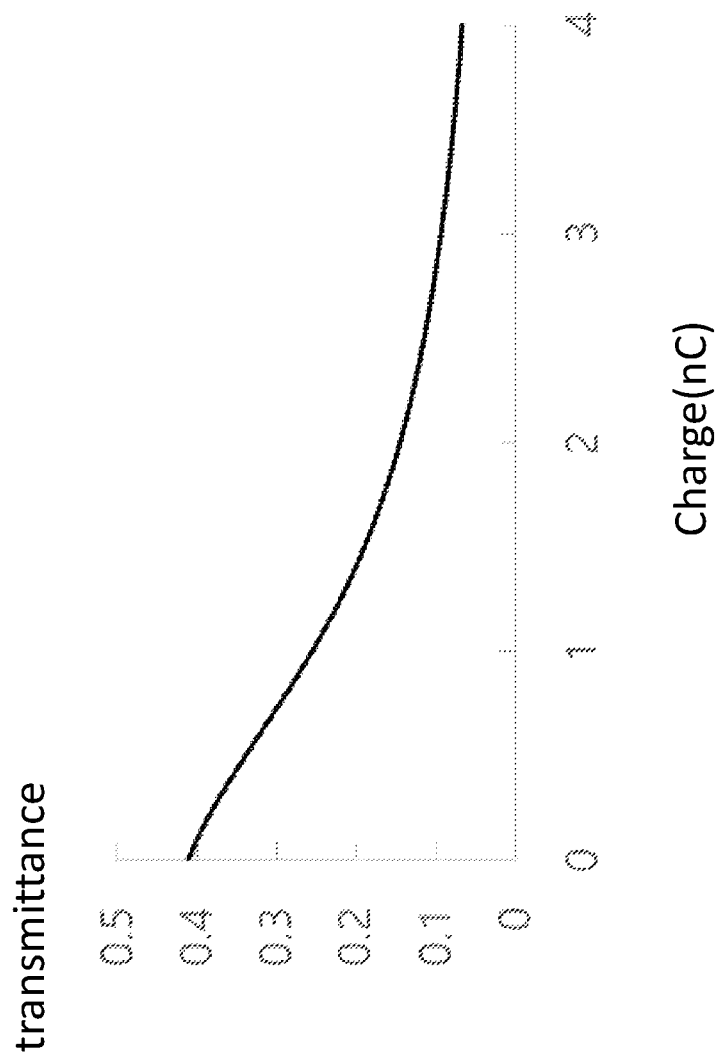
FIG. 13 is a transmittance curve according to an amount of charge accumulated in a photoconductive layer at a field of view (20,225) of a liquid crystal layer.
Figure 14:
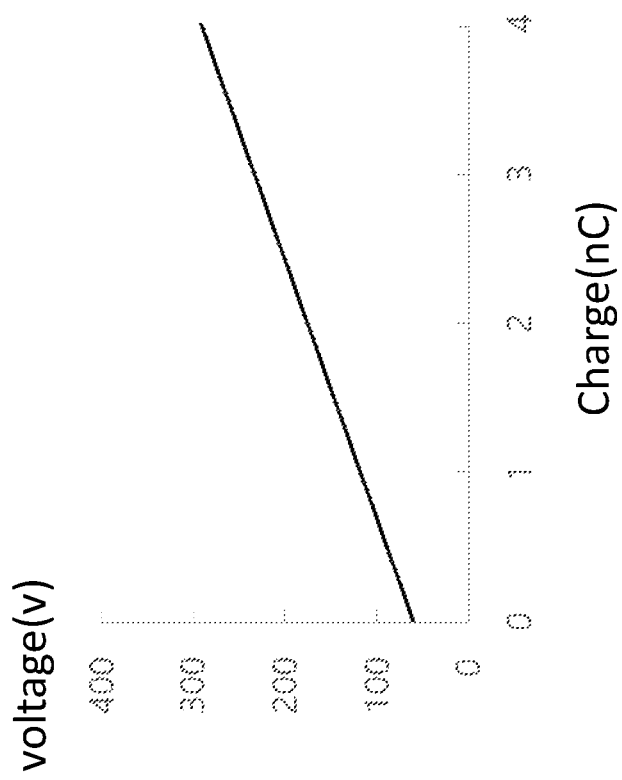
FIG. 14 is a graph showing a correlation between a bias voltage of a reference transmittance curve and an amount of charge in a photoconductive layer of a pixel corresponding to a field of view (20,225) of a liquid crystal layer.

FIG. 12 is a reference transmittance curve of a pixel corresponding to a field of view (20,225) of a liquid crystal layer according to one embodiment of the present invention. FIG. 13 is a transmittance-to-charge curve of a photoconductive layer corresponding to a pixel of an image pickup unit according to one embodiment of the present invention. The pixel shown in FIG. 13 is a pixel corresponding to a field of view (20,225) at a measurement voltage of 60 V. FIG. 14 is a graph showing a bias voltage of a reference transmittance curve with respect to a charge amount of a photoconductive layer of a pixel of an image pickup unit according to one embodiment of the present invention. In FIG. 14, a particular pixel is a pixel corresponding to a field of view (20,225) at a measurement voltage of 60 V. In FIG. 14, a proportional constant (k) is 0.17285.

Referring to FIGS. 11 to 14, a reference transmittance curve is generated by varying the bias voltage in a state in which X-rays are not applied to a liquid crystal layer. A detection transmittance is measured by applying a measurement voltage. A bias voltage corresponding to the detection transmittance is determined with reference to the reference transmittance curve. It can be seen that a value that is equal to the determined bias voltage minus the measurement voltage is proportional to the amount of charge generated by X-ray irradiation for all of the pixels.

Next, the charge density a of the pixel is calculated according to Equation 3 on the basis of the determined bias voltage and the measurement voltage. Through the processes described above, an X-ray image of a pixel can be determined.

In conclusion, the X-ray image determination method described above can correct a difference in read beam transmittance attributable to a difference in field of view of each pixel and correct an error of the intensity of the read beam detected by each pixel, thereby providing an accurate X-ray diagnostic image and securing the linearity of a liquid crystal X-ray detector.

Although preferred embodiments of the present invention have been described and illustrated using specific terms, it is apparent that those terms are used only for clarification of the present invention but not for limiting the scope of the present invention. Accordingly, it is apparent that those embodiments and terms can be modified, changed, altered, and substituted without departing from the technical spirit and scope of the present invention as defined in the appended claims. It should be noted that modifications and equivalents to the embodiments fall within the scope of the present invention.

What is claimed is:

1. A method of determining an X-ray image using an X-ray sensing liquid crystal panel including a photoconductor unit and a liquid crystal unit provided on the photoconductor unit, the method comprising:
    a first step of measuring a reference transmittance of a pixel while varying a bias voltage applied to the X-ray sensing liquid crystal panel in a state in which the X-ray sensing liquid crystal panel is not irradiated with an X-ray;
    a second step of separating electrons and holes in the photoconductor unit by applying a separation voltage to the X-ray sensing liquid crystal panel and irradiating the X-ray sensing liquid crystal panel with an X-ray;
    a third step of measuring a detection transmittance of a pixel by applying a measurement voltage to the X-ray sensing liquid crystal panel;
    a fourth step of deriving a bias voltage of a reference transmittance of the pixel corresponding to the detection transmittance; and
    a fifth step of determining an X-ray image of the pixel by subtracting the measurement voltage used in the third step from the bias voltage derived in the fourth step.

2. The method according to claim 1, wherein in the third step, the detection transmittance is measured while maintaining the measurement voltage.

3. The method according to claim 1, wherein in the third step, the detection transmittance is measured while varying the measurement voltage.

4. The method according to claim 1, wherein in the fifth step, the X-ray image of the pixel is determined on the basis of a charge density σ calculated according to Equation 3, $$\text{Charge density } \sigma = k(Vb - Vm) \quad \text{Formula 3}$$

(where Vb is a bias voltage used in the fourth step, Vm is a measurement voltage used in the third step, and k is a proportional constant).

5. The method according to claim 1, wherein in the third step, the detection transmittance of the pixel is measured multiple times.

* * * * *